(12) United States Patent
Yoshida et al.

(10) Patent No.: US 7,663,387 B2
(45) Date of Patent: Feb. 16, 2010

(54) TEST SOCKET

(75) Inventors: Takuto Yoshida, Tokyo (JP); Alvy V. Padiyil, Sunnyvale, CA (US)

(73) Assignee: Yokowo Co., Ltd., Tokyo (JP)

( * ) Notice: Subject to any disclaimer, the term of this patent is extended or adjusted under 35 U.S.C. 154(b) by 126 days.

(21) Appl. No.: 11/905,175

(22) Filed: Sep. 27, 2007

(65) Prior Publication Data

US 2009/0085593 A1    Apr. 2, 2009

(51) Int. Cl.
G01R 31/02    (2006.01)
G01R 31/26    (2006.01)

(52) U.S. Cl. .................. 324/755; 324/754; 324/761; 324/158.1; 439/169; 439/482

(58) Field of Classification Search ......... 324/754–765, 324/158.1; 439/169, 482
See application file for complete search history.

(56) References Cited

U.S. PATENT DOCUMENTS

| | | | | |
|---|---|---|---|---|
| 4,835,464 A | * | 5/1989 | Slye et al. | 324/763 |
| 6,603,322 B1 | * | 8/2003 | Boll et al. | 324/754 |
| 7,449,900 B2 | * | 11/2008 | Yamagishi | 324/754 |

FOREIGN PATENT DOCUMENTS

JP    2007-178164    7/2007

* cited by examiner

*Primary Examiner*—Ha Tran T Nguyen
*Assistant Examiner*—Emily Y Chan
(74) *Attorney, Agent, or Firm*—Morgan, Lewis & Bockius LLP

(57) ABSTRACT

A support block has a first face, a second face opposed to the first face, and first and second through holes communicating between the first face and the second face, and is formed with resin material. The first face, the second face, and the first and second through holes are covered with an electrically conductive plated coating. First and second probes are electrically connected to terminals of a device to be tested provided on a side of the first face and to terminals connected to a testing apparatus provided on a side of the second face. The first probe is provided in the first through hole and is electrically connected to the plated coating on the first through hole, the second probe is provided in the second through hole and is electrically connected to the plated coating on the second through hole. A pattern for defining a first region electrically connected to the first probe via the plated coating and a second region electrically connected to the second probe via the plated coating is formed by partially removing the plated coating on the first face and the second face, where the second region is electrically isolated from the first region. Electrodes of an electronic component are respectively connected to the first and second regions.

6 Claims, 13 Drawing Sheets

TEST SOCKET

BACKGROUND OF THE INVENTION

The present invention relates to a test socket which interconnects electrode terminals (lead terminals) of a device to be tested and wiring terminals to be connected to a testing apparatus by means of probes which are supported by a support block, for the purpose of testing electrical performance of the device to be tested such as an IC, before the device is actually assembled into a circuit. More particularly, the invention relates to the test socket, in which a component can be mounted between the probes.

Test for testing performance of a device (an object to be tested) such as a semiconductor wafer, an IC or a module, by inputting an electric signal to the device, has been generally conducted. In case of conducting such test of electrical performance of the device, there has been employed a test socket such as an IC socket which is provided with probes for interconnecting wiring terminals on a wiring board on which ends of leads to be connected to a testing apparatus are collected and electrode terminals (lead terminals) of the device. This test socket is constructed, as shown in FIG. 10 for example, in such a manner that a support block 72 for supporting probes 71 is formed with through holes, into which the probes 71 for signals, for power supply, and for grounding are inserted, and then, the electrode terminals (the lead terminals) of the device to be tested (not shown) which is provided on one face of the socket (an upper side in the drawing) are electrically connected to the wiring terminals of the wiring board (not shown) which is provided on the other face of the socket (a lower side in the drawing), thereby to conduct the test. A device guide 74 for positioning the device to be tested is provided on an outer face of this support block 72 at a side where the device to be tested is mounted, integrally with the support block 72 or formed as a separate component to be fixed by means of screws or the like which are not shown. In FIG. 10, reference numeral 73 designates holding plates for holding the probes 71 so as not to escape, and 76 designates positioning pins for positioning the test socket with respect to the wiring board.

With recent progress of high frequency, high speed, and high performance of the device (the above described device to be tested), various performances are required to be added to the test socket which is used for testing the device to be tested. As one of examples, it is requested that the test socket is equipped with a bypass chip capacitor. Generally, the bypass chip capacitor for the probe for power supply is mounted on a wiring pattern which is the closest to the device in electric distance, on the wiring board at a lower face side of the test socket. Specifically, as seen from the device to be tested, power passes through the probes in the test socket and the pattern on the wiring board until it reaches the chip capacitor. However, due to recent progress of high frequency, high speed, and high performance of the device, inductance component that inherently exists in the probes in the test socket may sometimes become a factor for causing instable operation of the device. For this reason, it is requested that the bypass chip capacitor is arranged more close to the device to be tested. In short, this requires such an arrangement that this chip capacitor is mounted at a position directly below the device to be tested and also above the test socket.

In the test socket in the related art, the support block for supporting the probes has been formed of resin or metal. Accordingly, it has been difficult to connect the component such as the chip capacitor between the specified probes, even if so desired.

FIG. 11 shows a side view of the test socket in the related art, in which a chip capacitor is soldered to probe tubes. In the test socket in FIG. 11, a holding plate 83 at an upper side of a support block 82 is removed, and only a holding plate 83 at a lower side of the support block is shown. This support block 82 and the holding plate 83 are formed of resin. FIG. 12 is an enlarged perspective view of FIG. 11. A chip capacitor 89 is soldered (solder is denoted by S2, in the drawings) to probe tubes 81 (herein, denoted by reference numeral 81 including the probes) at their parts projected from an upper face of the support block 82. For this purpose, a relief part, which is not shown, is provided on the holding plate 83 which is disposed on the support block 82, at a position corresponding to the chip capacitor 89 so that the holding plate 83 may not interfere with the chip capacitor 89. In FIGS. 11 and 12, a pitch between the probes 81 is 1.0 mm, a size of the chip capacitor 89 is 1.0 mm×0.5 mm×0.5 mm. Therefore, it is necessary to use a soldering tool exclusive for this purpose, and high technique for soldering is also required. Further, unless the chip capacitor 89 is attached to the two probes 81 in an accurate position, forces applied to the two probes 81 are not likely to be balanced, and so, there is such anxiety that abrasion and cracks may occur in the probes 81 and electrodes of the chip capacitor 89. In short, there occurs a problem that reliability and durability of the test socket are deteriorated. Moreover, in case where the pitch between the probes 81 is reduced to 0.5 mm which is currently a mainstream, it is necessary to use a chip capacitor which is further compact having a size of 0.6 mm×0.3 mm×0.3 mm, for example, as the chip capacitor 89 to be attached, and higher technique is required for soldering, which may result in more remarkable deterioration of reliability and durability of the test socket. Further, in case of exchanging the probes 81 for maintenance, the chip capacitor 89 which has been soldered must be removed, and soldering work must be conducted again, for attaching the chip capacitor 89 after the probes 81 have been exchanged.

FIG. 13 shows a sectional view of the test socket in the related art, employing a support block formed of metal. In the test socket in FIG. 13, while it is not shown specifically the chip capacitor is soldered to the probe tubes in the same manner as in the test socket as shown in FIGS. 11 and 12, and correspondingly, a relief part for preventing interference with the chip capacitor is formed in a fixing plate at an upper side of the support block.

Use of metallic material for a support block 92 for supporting probes 91 as shown in FIG. 13 is effective for preventing noises. A metal plate formed of brass or aluminum, for example, is used for the support block 92.

In order to enhance RF performance of the test socket (high frequency in analogue form is referred to as the high frequency, while very short pulse width and short pulse interval in digital form are referred to as the high speed, both of which are hereinafter referred to as an RF), it is necessary to form the probe 91SIG for signals in a coaxial structure, and to reliably connect the probe 91GND for grounding to the ground in vicinity of the probe 91SIG for signals. For this purpose, the probe 91SIG for signals is formed in a coaxial structure in such a manner that the probe is used as a center conductor, and an inner wall of a through hole 95 in the support block 92 is used as an external conductor, with forming a space between them. An outer diameter d of the probe 91SIG and an inner diameter D of the through hole 95 are so set as to make a determined impedance. By constructing the probe 91SIG for signals in this manner, dielectric constant becomes 1, because a hollow space is formed between the center conductor and the external conductor, and therefore the coaxial structure of the determined impedance can be obtained even at a narrow pitch, even in case where an interval between the electrode terminals becomes very small due to a recent stream of downsizing and high density of the device. The probe 91GND for grounding is inserted into the through hole 95 in the support block 92 interposing a bell-shaped metal tube 97 having slots, for example, so that the probe can be reliably brought into contact with the support block 92. On the other hand, the probe 91POW for power supply is inserted into the through hole 95 in the support block 92 interposing an insulating tube 98 so as not to get in touch with the support block 92.

In the probe 1SIG for high frequency and high speed signals, the inner diameter D of the through hole 95 in the support block 92 and the outer diameter d of the probe 1SIG for signals are set so as to satisfy the following formula (1) and so as to obtain the coaxial structure having a determined impedance $Z_0$. In the formula (1), $\in_r$ is a dielectric constant of dielectric substance between the center conductor and the external conductor. According to the structure as shown in FIG. 13, because an air space is formed between the probe 1SIG for signals as the center conductor and the through hole 95 of the support block 92 as the external conductor, the dielectric constant $\in_r$ becomes 1. In this manner, it is possible to cope with the narrow pitch of the probes 91.

[Formula 1]

$$Z_0 = \frac{60}{\sqrt{\varepsilon_r}} \log_e \frac{D}{d} \quad (1)$$

In case of the test socket as shown in FIG. 13, use of the support block formed of metal is convenient for enhancing shield performance, and for constructing the coaxial probe. However, because the support block is formed of metal, there is such a risk that the chip capacitor may get in touch with the support block to make a short circuit, incurring a problem that reliability is deteriorated.

SUMMARY

It is therefore an object of the invention to provide a test socket which is so constructed that the test socket can be equipped with components such as a chip capacitor, and which is excellent in reliability and durability.

In order to achieve the object, according to the invention, there is provided a test socket, comprising:

a support block formed with resin material, having a first face, a second face opposed to the first face, and a first through hole and a second through hole which communicate between the first face and the second face, the first face, the second face, and the first and second through holes being covered with an electrically conductive plated coating;

a first probe and a second probe, electrically connected to terminals of a device to be tested which is provided on a side of the first face and to terminals connected to a testing apparatus which is provided on a side of the second face, the first probe being provided in the first through hole and electrically connected to the plated coating on the first through hole, the second probe being provided in the second through hole and electrically connected to the plated coating on the second through hole; and an electronic component, wherein a pattern for defining a first region electrically connected to the first probe via the plated coating and a second region electrically connected to the second probe via the plated coating is formed by partially removing the plated coating on the first face and the second face, the second region being electrically isolated from the first region, and electrodes of the electronic component are respectively connected to the first region and the second region.

DETAILED DESCRIPTION OF PREFERRED EMBODIMENTS

Figure 1:
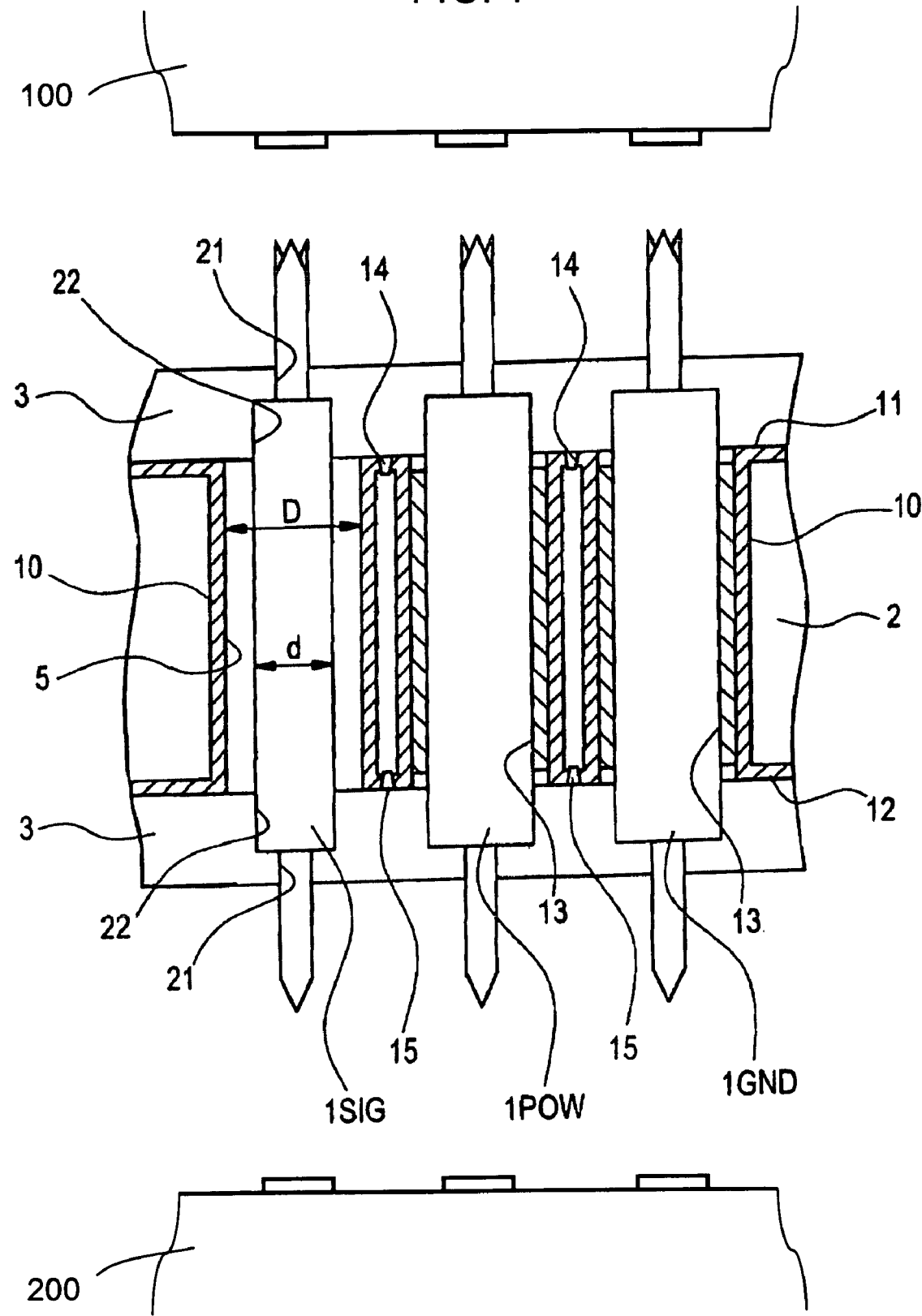
FIG. 1 is a sectional view of a test socket in a first embodiment according to the invention.

Now, an embodiment of the test socket according to the invention will be described referring to the drawings.

To begin with, a first embodiment of the invention will be described hereunder.

The test socket according to the invention includes, as shown in FIG. 1 for example, an insulating support block 2 which is formed of resin material or the like, and provided with through holes 5 into which a probe 1SIG for RF signals, a probe 1GND for grounding, and a probe 1POW for power supply (probes for low frequency and low signal are herein treated in the same manner, for convenience' sake) can be inserted. Plated coatings 10 are provided on an outer face of the support block 2 and on exposed faces of the through holes 5. The probe 1SIG for signals, a probe 1GND for grounding, and a probe 1POW for power supply are inserted into the through holes 5 in the support block 2. Electrode terminals of the device to be tested 100 such as an IC which is provided on one face (an upper face) 11 (an upper side in the drawing in the embodiment as shown in FIG. 1) of the support block 2 are connected to wiring terminals connected to a testing apparatus 200 which is provided on the other face (a lower face) 12 (a lower side in the drawing in the embodiment as shown in FIG. 1) of the support block 2 by means of the respective probes 1 whereby test is conducted.

In the related art, the probe for power supply is inserted into the support block with a tube formed of polyimide (an insulating tube) being interposed for the purpose of avoiding contact with the support block formed of metal. However, in this invention, the probe 1POW is so adapted to be electrically connected to the through hole 5 (the plated coating 10 applied to an inner face thereof) employing a ground tube 13 for the probe for grounding so as to be connected to a chip capacitor 9. The probe 1GND is also inserted into the through hole 5 together with the ground tube. The ground tube 13 is formed of phosphor bronze, for example.

The probes 1 are held and fixed in the support block 2 by means of a holding plate 3 which is formed of resin and provided on an upper face 11 and a lower face 12 of the support block 2. The plated coating 10 which is formed on an entirety of the outer face of the support block 2 is scraped off at determined positions, so that the scraped-off portions on the plated coating 10 form grooves 14, 15 (FIGS. 2 and 3) on the support block 2.

The plated coatings 10 are formed by applying plating to the entire outer face of the support block 2 and all the exposed faces in the through holes 5, and composed of an Ni plated coating of about 2 to 3 μm which is formed by electroless nickel plating and an Au plated coating of about 3 μm which is formed thereon continuously by electroless plating.

Figure 2:
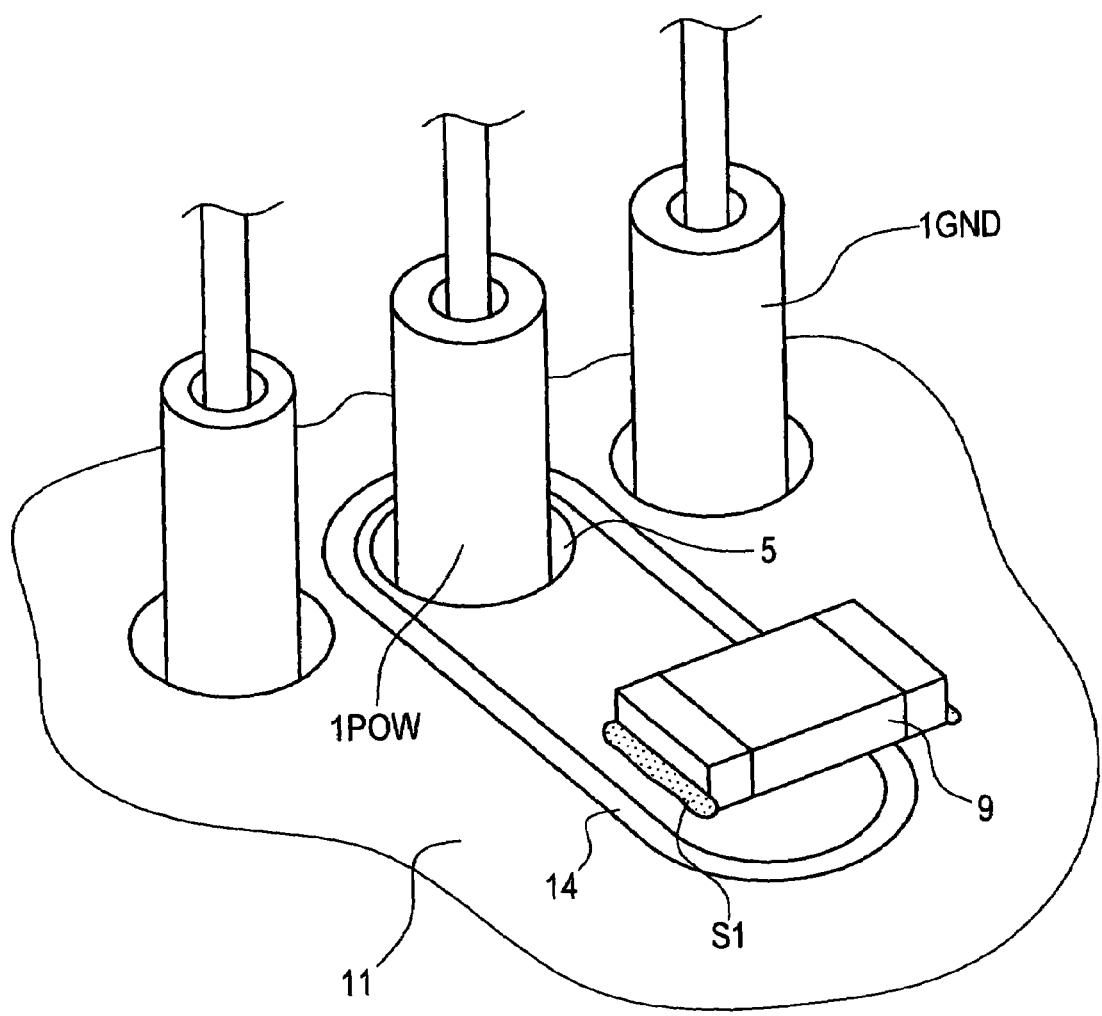
FIG. 2 is an enlarged perspective view of the test socket as shown in FIG. 1 in a state where a holding plate at an upper side is removed.
Figure 3:
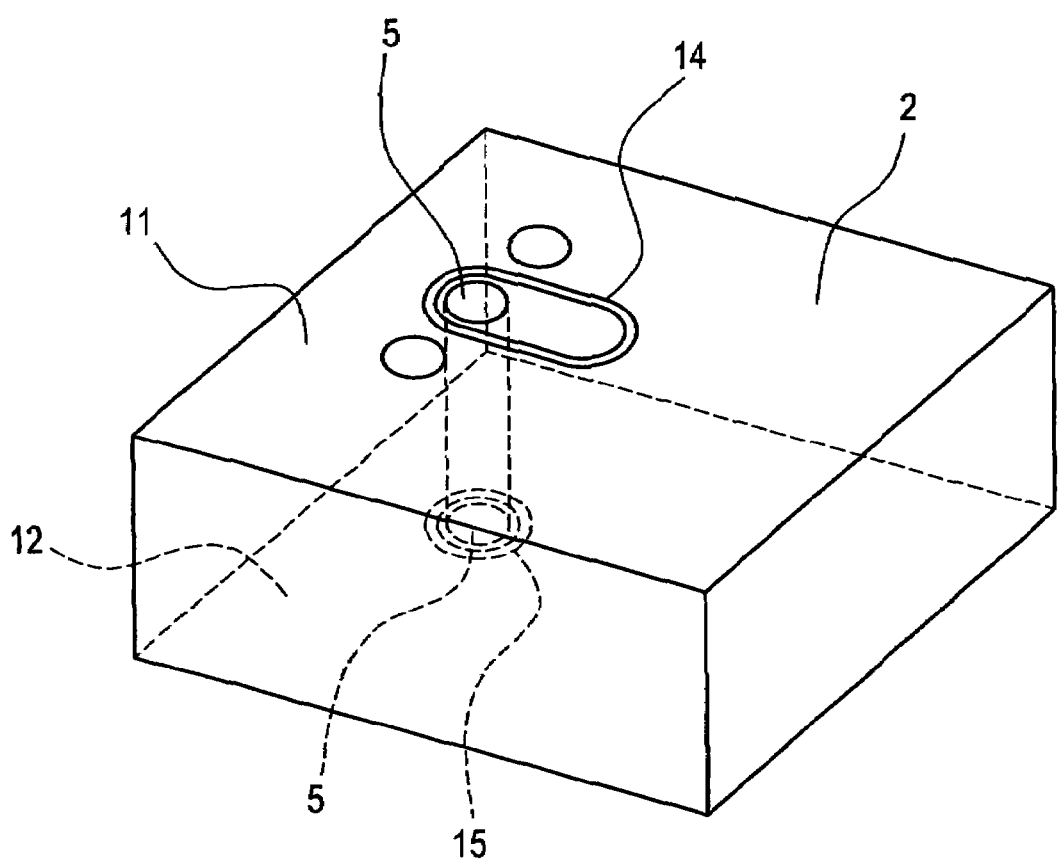
FIG. 3 is a schematic view showing only a support block of the test socket as shown in FIGS. 1 and 2.
Figure 4:
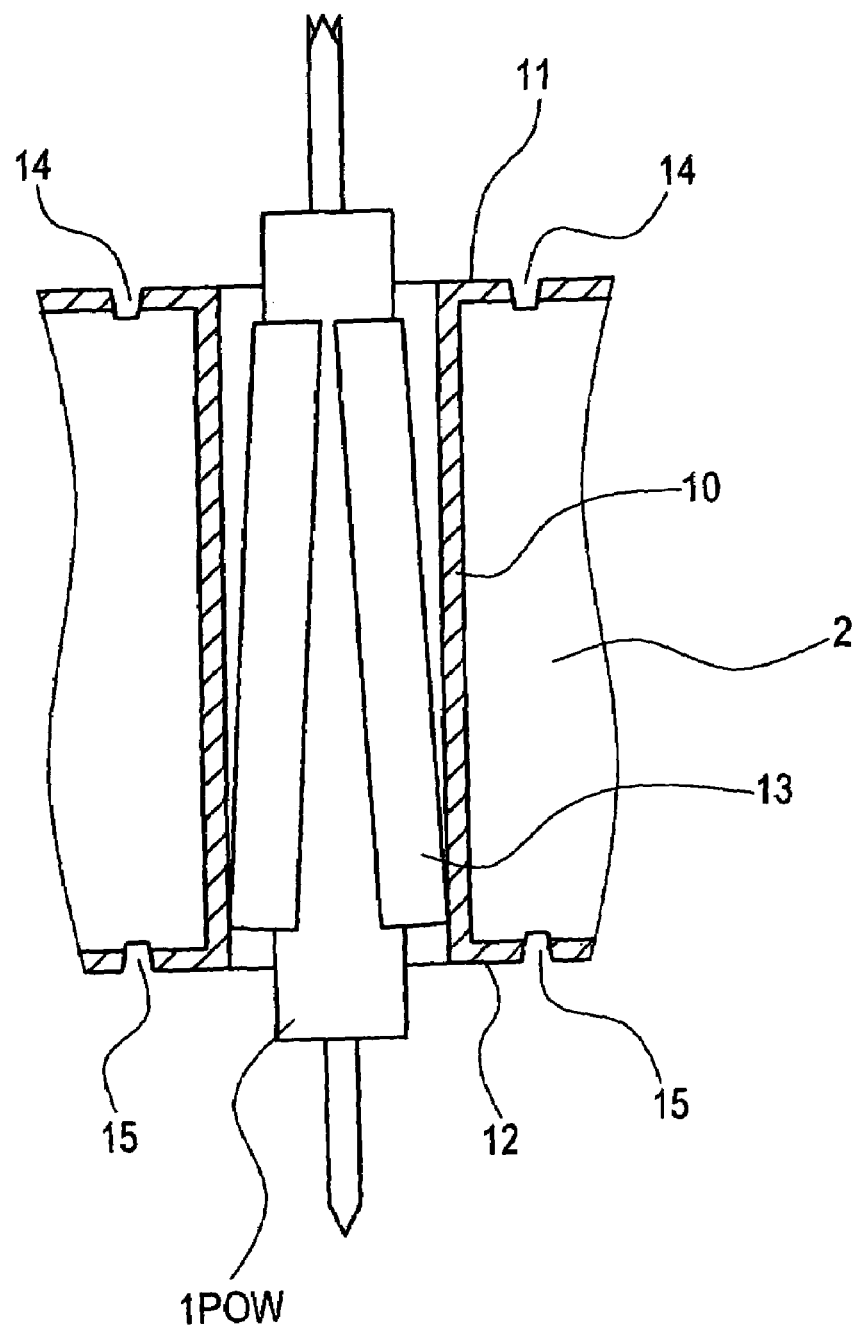
FIG. 4 is a sectional view showing a probe for power supply in a state inserted into a through hole in the support block.

FIG. 2 is an enlarged perspective view showing the test socket in a state where the holding plate 3 at the upper side is removed. FIG. 3 is a schematic view showing only the support block 2 of the test socket as shown in FIGS. 1 and 2. FIG. 4 is a sectional view showing a state where the probe 1POW is inserted into the through hole 5 in the support block 2. In FIG. 4, the holding plates 3 both at the upper side and the lower side are removed.

In this invention, the description will be made referring to such a chip capacitor 9 that it is used as a bypass capacitor, and that one of its electrodes is connected to the probe 1POW, while the other electrode is connected to the probe 1GND. Moreover, in the following description, the chip capacitor is described as the component to be equipped between the probes. However, as the components to be equipped, active components such as a transistor, diode, etc. may be also used, besides passive components such as an inductor, resistor, etc.

On the face 11 of the support block 2 at the side opposed to the device to be tested (the upper face), the plated coating 10 is scraped off so as to form an insulated pattern (electrically isolated) up to a determined position to which the chip capacitor 9 may be soldered. In FIG. 2, the groove 14 in a rectangular shape is formed on the upper face 11 of the support block 2. One of the electrodes of the chip capacitor 9 is attached to a determined position on the plated coating 10 by soldering (solder is denoted by S1 in FIG. 2), thereby to be connected to the probe 1POW. The other electrode of the chip capacitor 9 is attached to a region which is not connected to the probe 1POW (insulated from the probe 1POW) on the plated coating 10 by soldering, and connected to the probe 1GND. In this manner, the probe 1POW is connected to the chip capacitor 9 by way of the ground tube 13, the inner face of the through hole 5 in the support block 2, and the upper face 10 of the support block 2.

On the other hand, on the face 12 of the support block 2 at the side opposed to the wiring board (the lower face), the plated coating 10 around the through hole 5 into which the probe 1POW is inserted is scraped off in a circular shape, whereby the through hole 5 is surrounded by the circular groove 15 (See FIG. 3). In this manner, the inner face of the through hole 5 in the support block 2 is insulated from the lower face 12 of the support block 2.

The holding plate 3 which is mounted on the upper face 11 of the support block 2 is formed with a relief part, which is not shown, for avoiding interference with the chip capacitor 9 which has been attached to the support block 2 in a manner as described above.

As described above, the ground tube 13 as shown in FIG. 4 is inserted into the through hole 5 in the support block 2 together with the probe 1POW. The ground tube 13 has a bell-like shape in which its upper part is narrowed to clamp the probe 1POW, and its lower part is enlarged contrary to the upper part, thereby to provide stable connection to the plated coating 10 of the through hole 5 in the support block 2.

Figure 5:
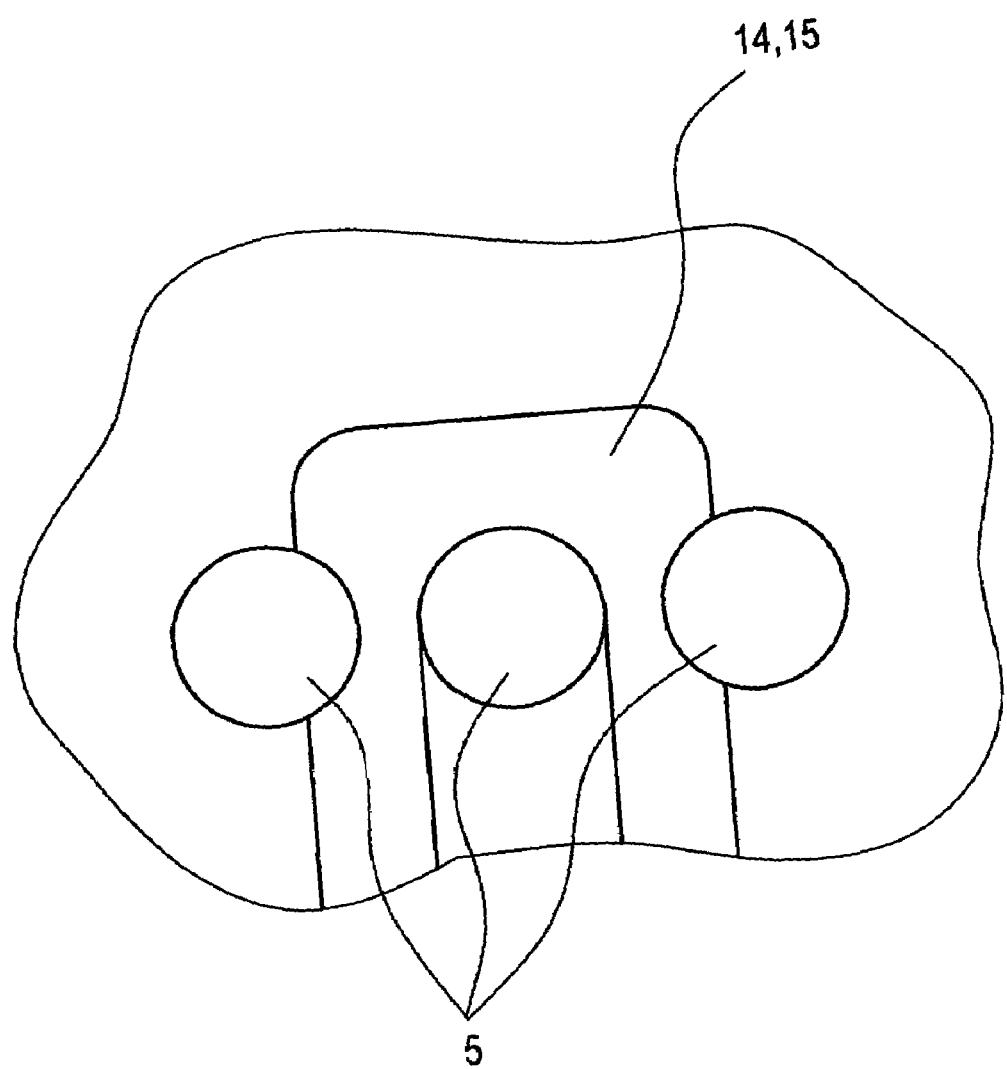
FIG. 5 is a schematic view showing a groove.

The grooves 14, 15 are formed through a very thin drill or a router which is used by a dentist, for example, so as to have a width of about 0.5 mm to 1.0 mm. The grooves 14, 15 are formed by scraping off the plated coating 10 so that the determined through hole 5 into which the determined probe 1 is inserted may be electrically isolated from the determined region on the support block 2. The grooves 14, 15 need not be necessarily formed by scraping off the plated coating 10 after plating has been performed, but it is possible to form the grooves 14, 15, by applying the plating, after a mask has been formed so that the plating may not be coated when the plated coating 10 is formed. These grooves 14, 15 may be formed so as to be overlapped with the through holes 5 as shown in FIG. 5.

Figure 6:
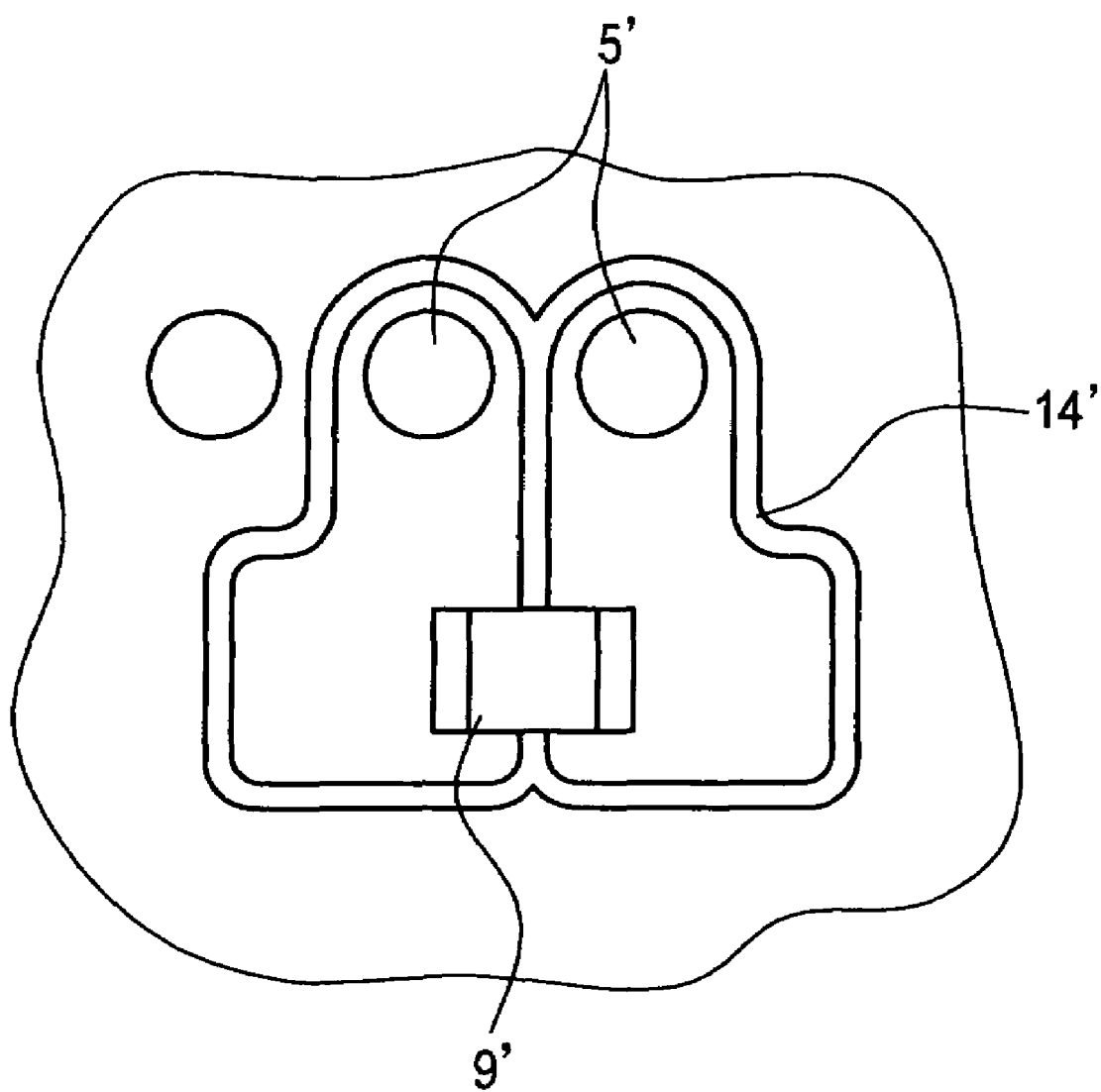
FIG. 6 is a schematic view showing a modification of the first embodiment according to the invention.

As another modification, an embodiment in which a chip capacitor is connected to two specified probes, but not connected to one specified probe (the probe 1POW in the above described embodiment) and the ground (the probe 1GND in the above described embodiment) is shown in FIG. 6. In FIG. 6, the through holes into which the probes are inserted, the chip capacitor, and the groove formed by scraping off the plated coating are denoted by numerals 5', 9', and 14' respectively. Moreover, although the chip capacitor is connected between the adjacent two probes in the embodiment in FIG. 6, it is also possible to connect the chip capacitor between the desired probes which are remote from each other.

Figure 7:
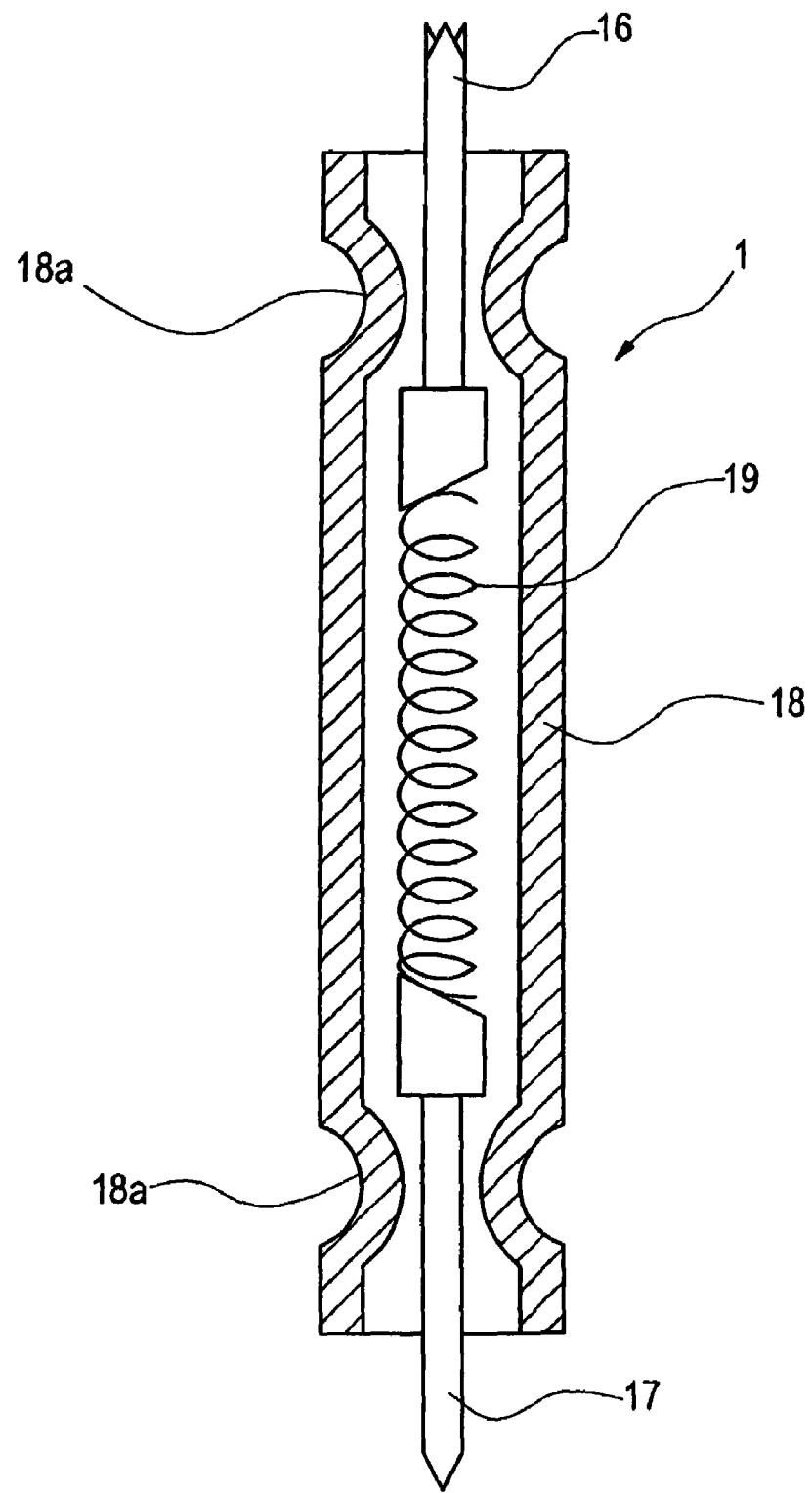
FIG. 7 is a sectional view showing a structure of a contact probe which an example of the probe.

In this invention, the probe means a connecting pin which interconnects a wiring terminal on a wiring board with an electrode terminal (a lead terminal) of a device to be tested. Specifically, the embodiment employs as the probe 1, a contact probe of a type that a plunger (a lead conductor) at a distal end of the connecting pin is provided so as to move by a spring as shown in FIG. 7, thereby keeping reliable contact between the device to be tested and the wiring board. However, the probe 1 is not necessarily limited to such a movable pin type, but may be a pin having a certain length whose distal end is not movable. The contact probe 1 has such a structure, as a sectional view of an example is shown in FIG. 7 for example, that a spring 19 and one ends of plungers 16, 17 are contained inside a metal pipe 18, and the plungers 16, 17 are formed so as not to escape from the metal pipe 18 by neck portions 18a provided on the metal pipe 18, while they are urged outward by the spring 19. When the distal ends of the plungers 16, 17 are pressed, the spring 19 is contracted to push the plungers 16, 17 into the metal pipe 18, and while a force is not applied, the distal ends of the plungers 16, 17 are projected about 1 mm, for example. Moreover, the distal end of the plunger 16 to be brought into contact with the electrode terminal of the device to be tested is preferably split in four so that reliable contact can be obtained.

When the device to be tested, which is not shown, is set on the test socket, the plunger 16 of the probe 1 is connected to the electrode terminal of the device to be tested, while being merged to a surface of the holding plate 3. The plunger 17 at the lower side is put on the wiring terminal on the wiring board connected to the testing apparatus which is not shown, thereby to be connected to the wiring terminal while it is retracted up to an exposed face of the holding plate 3 at the lower side.

Although the plungers 16, 17 are provided at both ends of the probe in the embodiment as shown in FIG. 7, it would be sufficient that the plunger 16 is provided on at least one side of the probe which comes into contact with the device to be tested. The metal pipe 18 has a length of about a few millimeters and may be formed of nickel silver (an alloy of copper, nickel and zinc), for example. As the plungers 16, 17, linear material having a diameter of about 0.1 mm and formed of SK material or beryllium copper may be used. The spring 19 may be formed of a piano wire or the like. The contact probes 1 have substantially the same structure irrespective of their objects for use, namely, for signals, for power supply, and for grounding. However, the contact probe 1SIG for high frequency and high speed (RF) signals is used in a form of a coaxial structure employing this contact probe 1SIG as the internal conductor (the center conductor) and the plated coating 10 which is formed on the surface (the exposed face) of the through hole 5 as the external conductor, so that the outer diameter d (See FIG. 1) of the probe 1SIG and the inner diameter D of the plated coating 10 inside the through hole 5 (See FIG. 1) may satisfy a certain relation. In case of the testing apparatus having the pitch of 0.4 mm (the probes are provided in a matrix at a pitch of 0.4 mm) for example, d is φ0.15 mm, and the inner diameter D of the plated coating 10 is about φ0.35 mm. The contact probe 1POW for power supply and the contact probe 1GND for grounding are preferably as thick as possible, and are formed having such thickness as can be inserted into through holes 22 which have the substantially same size as the through hole 5 for the RF signals, according to the pitch.

The support block 2 is intended to hold the probe 1SIG, the probe 1POW, and so on for bringing them into contact with the electrode terminals of the IC or module which is the device to be tested, and can be formed of resin such as polyether imide (PEI), polyimide (PI), polyether ether ketone (PEEK), polyamide imide (PAI). The support block 2 is formed by cutting or molding for example, in such a manner that the through holes 5 for the above described probes 1 may be formed in a form of a matrix in a resin block having a plate-like shape.

Thickness and dimension of the support block 2 may vary depending on its object for use, such as the case where it is incorporated in the test socket (an IC socket) only for interconnecting the device to be tested with the wiring board provided with the wirings, or the case where it is incorporated in a testing jig to be connected to a board to which a coaxial cable or the like is connected, but usually, the support block 2 is formed having a thickness of about 3 to 8 mm, and an area of 30 to 50 mm square.

In the embodiment as shown in FIG. 1, the holding plate 3 is provided on both the faces of the support block 2 and is formed with an insulating board having through holes 21 and dented parts 22 at positions corresponding to the through holes 5 in the support block 2, and further having a relief part, which is not shown, at a position corresponding to the position where the chip capacitor 9 is provided. The holding plate 3 is formed of resin, for example, in a shape of a plate having a thickness of about 0.6 mm, and is provided with the through holes 21 through which the plungers 16, 17 can pass, in alignment with the positions of the probes 1. The dented parts 22 formed concentrically with the through holes 21 fix the probes 1 at their shoulder parts, that is, end parts of the metal pipes 18, in such a manner that the probes 1 may not escape. In the embodiment as shown in FIG. 1, the holding plate 3 is formed with resin such as polyether imide (PEI), with a view to more easily forming the through holes 21, the dented parts 22 and the relief part with accurate dimensions by resin molding, even in case where a number of the probes 1 are arranged in parallel at a narrow pitch. Moreover, since the resin has a large mechanical strength, the probes of several hundreds or more can be very stably fixed without occurring a warp in case where the holding plate 3 is formed with the above described thickness. However, any other material can be also employed, provided that the material has sufficient electrical insulativeness and mechanical strength, even though it is thin. In the embodiment as shown in FIG. 1, the probes are also fixed by the holding plate 3 having the same structure as the one for the upper side at the side opposed to the wiring board (the lower side in the drawing), so that the probes 1 may not escape to either side. This holding plate 3 is fixed to the support block 2 by means of screws or the like which are not shown.

The holding plate 3 need not necessarily have the same thickness both at the side opposed to the device to be tested and at the side opposed to the wiring board, and can be freely selected. Moreover, on the side in contact with the wiring board which is connected to the testing apparatus, in case where the same wiring board can be used irrespective of the type of the device to be tested, and the number of use times of the probe 1 is expected to be smaller as compared with the life of the probe 1, it is possible to fix one end of the probe 1 to the wiring board by soldering or so, thereby eliminating provision of the plunger 17 at the one end of the probe 1. Alternatively, it is possible to fix the probe 1 without providing the holding plate 3, by directly forming a dented part at the one face side of the support block 2, the dented part having a substantially same shape as the dented part 22 in the support block 2. Further, an insulating spacer may be provided in the dented part, according to necessity.

It is also possible to hold and fix the probes 1 by a metal plate formed of metal having the substantially same structure, in place of the holding plate 3 formed of resin. However, in case of fixing the probe which should not be directly fixed by the metal plate formed of metal, for example, the probe 1SIG for signals and the probe 1POW for power supply, it is necessary to insert an insulating spacer into a dented part (corresponding to the dented part 22) having a through hole (corresponding to the through hole 21). The probe 1GND for grounding may be fixed by the metal plate, because no problem arises even if the probe is directly brought into contact with the metal plate.

Further, it is considered to form a dented part having a through hole at only one side of the support block 2, in place of using the holding plate formed of resin or the metal plate for holding and fixing the probe 1.

According to the first embodiment of the invention as described above, the following effects can be obtained.

Because the chip capacitor can be mounted on the pattern which has been defined on the surface of the support block, it is possible to realize a reliable and durable test socket capable of being equipped with electric components.

Because the chip capacitor is not directly bonded to the probe, excessive stress is not exerted on both the members, and hence, reliability and durability will be enhanced.

Because the pattern is extended up to the position of the chip capacitor, it is possible to mount a chip capacitor of the size larger or smaller than a pitch between the probes.

Because the probe and the chip capacitor can be more freely connected, the chip capacitor can be connected not only between the adjacent probes but to a desired probe, depending on how to extend the pattern.

Even when the probe has been exchanged, it is unnecessary to mount the chip capacitor again.

Because the chip capacitor can be mounted in a large space, difficulty in mounting work will be eliminated.

Because there is almost no restriction in dimension of the chip capacitor, specification can be freely set.

Moreover, in the same concept as the first embodiment, two additional embodiments as described below are also considered.

Now, referring to FIG. 8, a second embodiment of the invention will be described.

Figure 8:
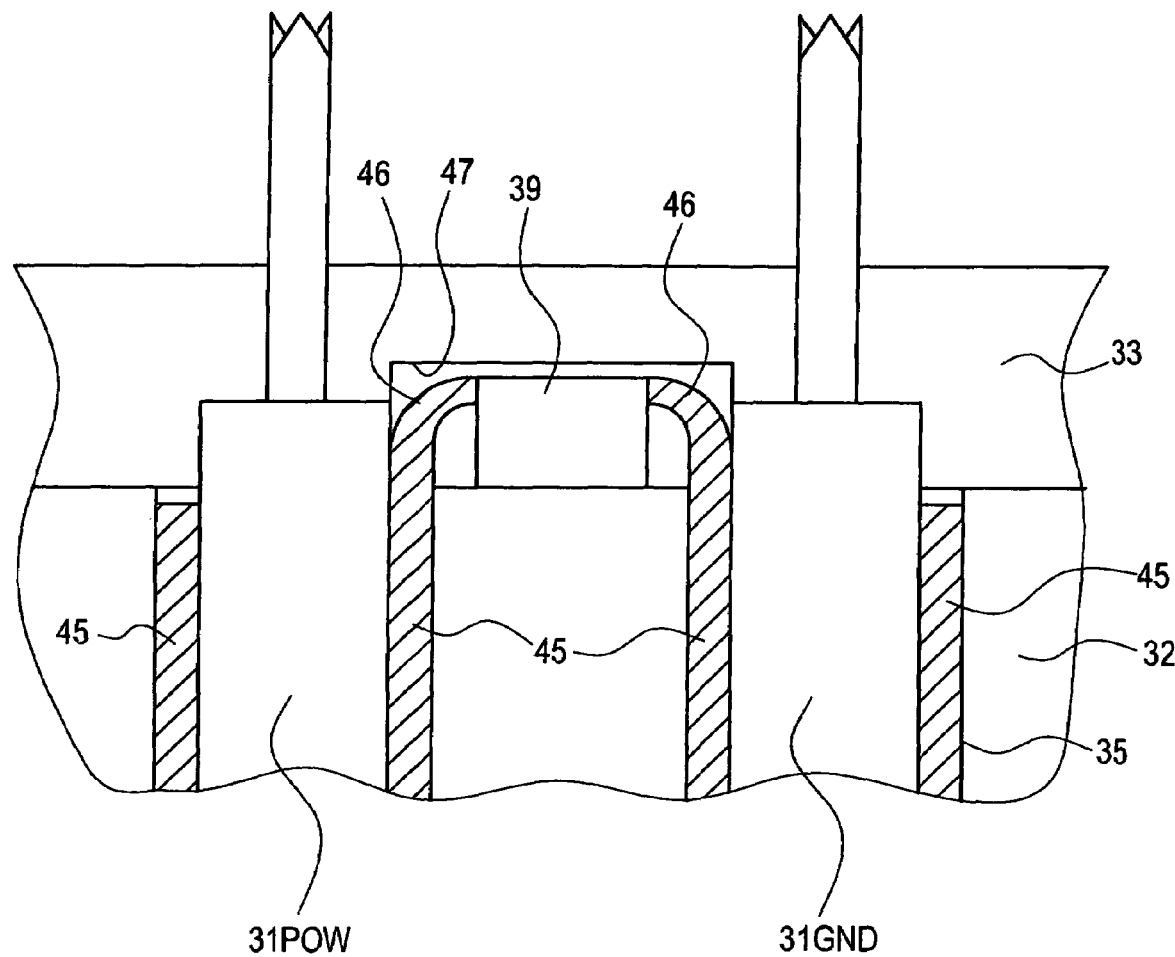
FIG. 8 is a sectional view for explaining a second embodiment of the invention.

FIG. 8 shows a manner of connecting a chip capacitor to two probes, namely, a probe for power supply and a probe for grounding. In the second embodiment, the chip capacitor is disposed on a support block in the same manner as in the first embodiment.

In FIG. 8, a probe 31POW and a probe 31GND are respectively inserted into through holes 35 which are formed in a support block 32 formed of rein, together with ground tubes 45 formed of metal. The probe 31POW and the probe 31GND are held and fixed by a holding plate 33 formed of resin. The ground tubes 45 covering the probe 31POW and the probe 31GND respectively have extended portions 46 which are respectively connected to a chip capacitor 39 by soldering or so. In FIG. 8, for simplifying the description, the chip capacitor 39 is arranged between the respective probes 31. Corresponding to each chip capacitor 39, the extended portions 46 are extended from a part of the ground tube toward the holding plate 33 at the upper side. Further, the holding plate 33 at the upper side has a relief part 47 corresponding to the position of the chip capacitor 39. However, arrangement of the chip capacitor 39 is not limited to the above, and it is possible to arrange the chip capacitor 39 at a desired position on the support block 32, according to a size of the chip capacitor 39 and other factors. A position and a length of the extended portions 46, and a position of the relief part 47 in the holding plate 32 may be determined according to the arrangement of the chip capacitor 39.

Then, a third embodiment according to the invention will be described referring to FIG. 9.

Figure 9:
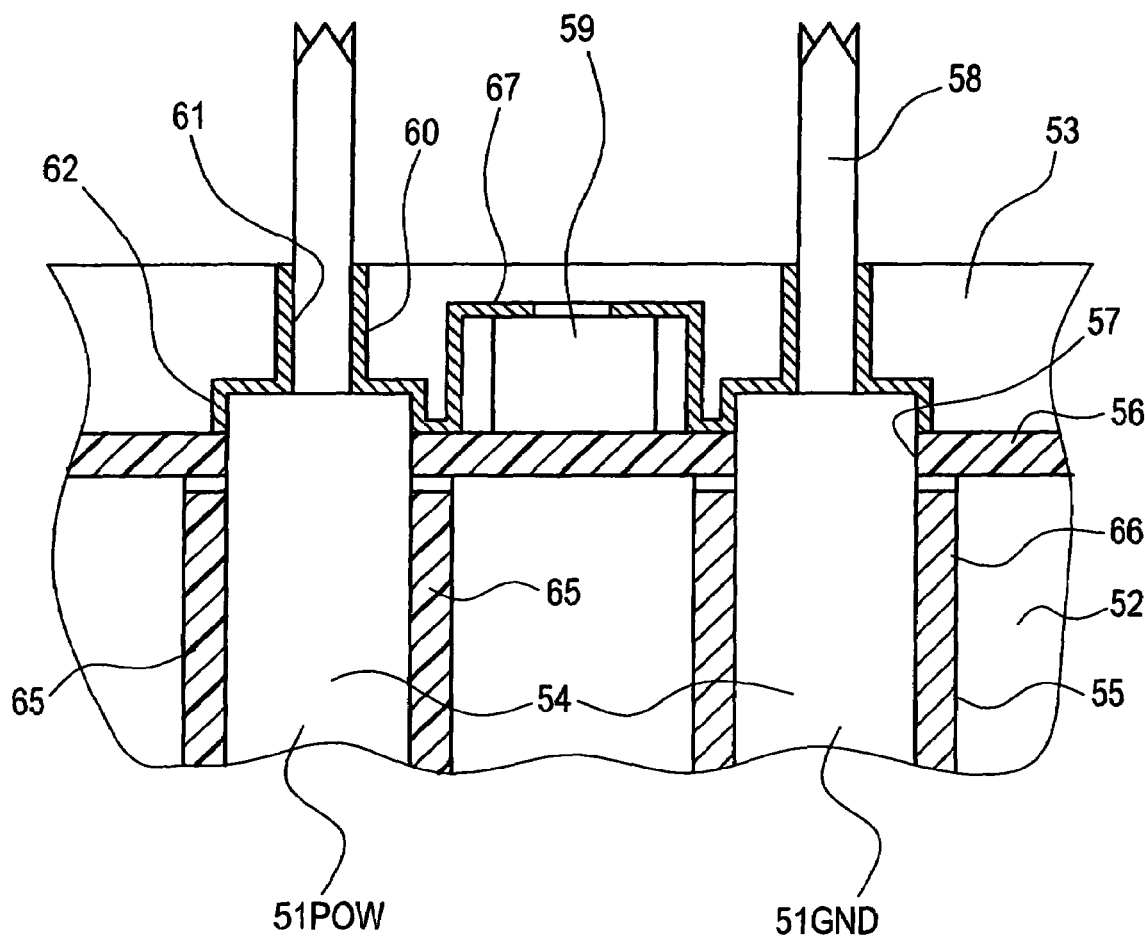
FIG. 9 is a sectional view for explaining a third embodiment of the invention.
Figure 10:
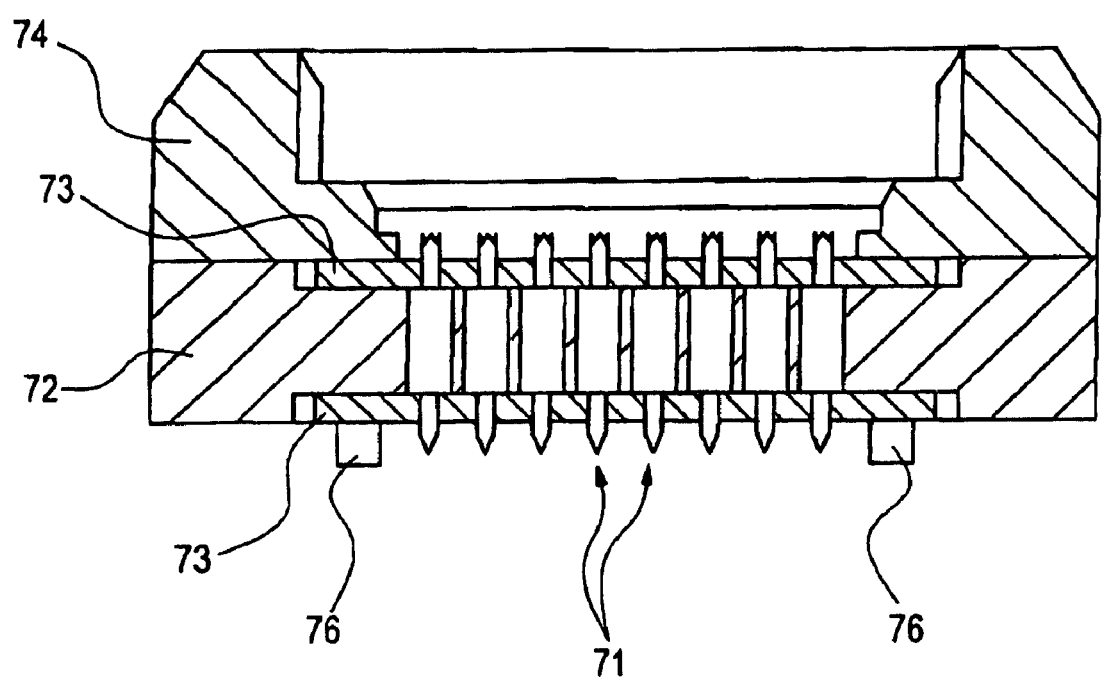
FIG. 10 is a view showing an example of a test socket in the related art.
Figure 11:
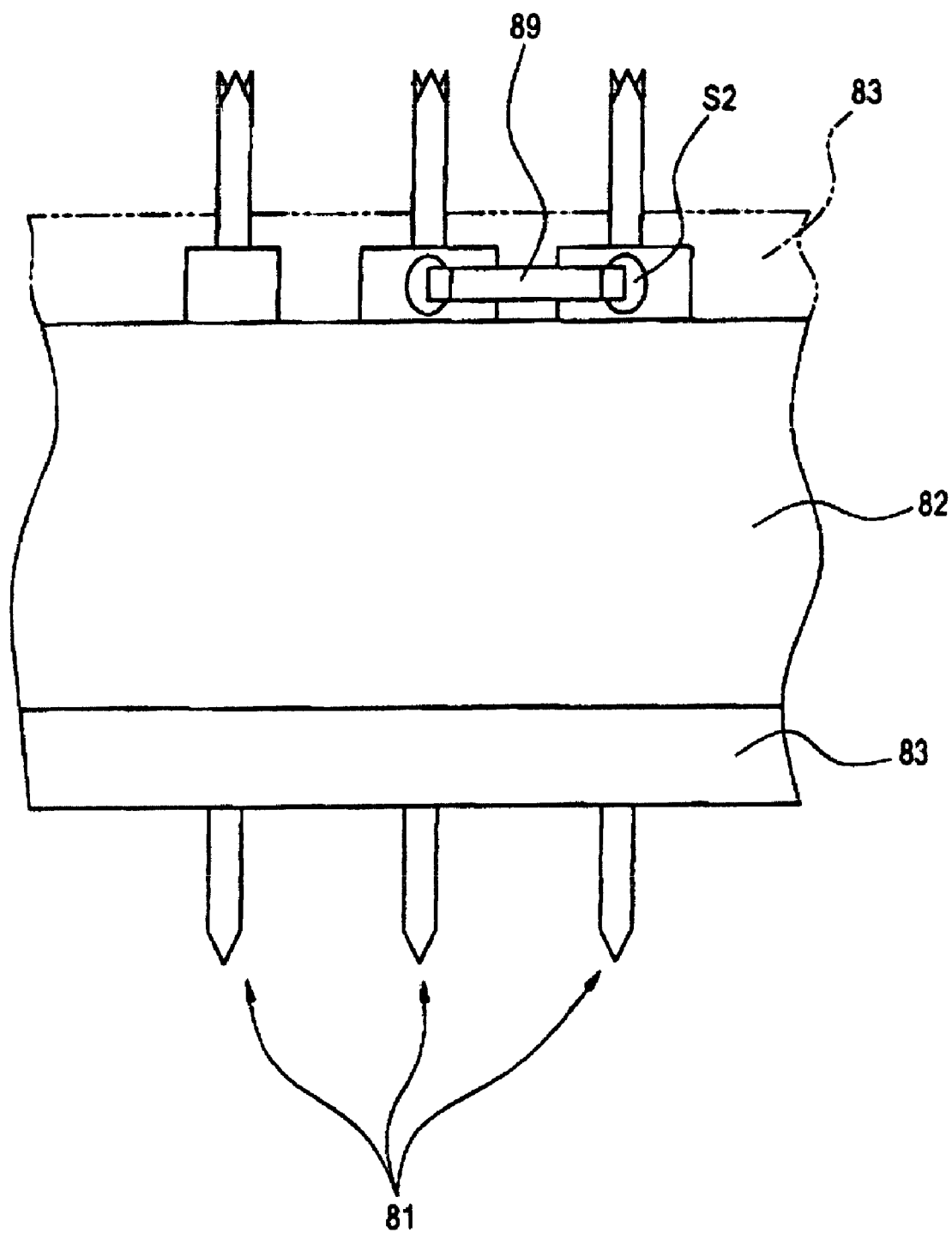
FIG. 11 is a side view showing an example of the test socket in the related art in which a chip capacitor is soldered to probes.
Figure 12:
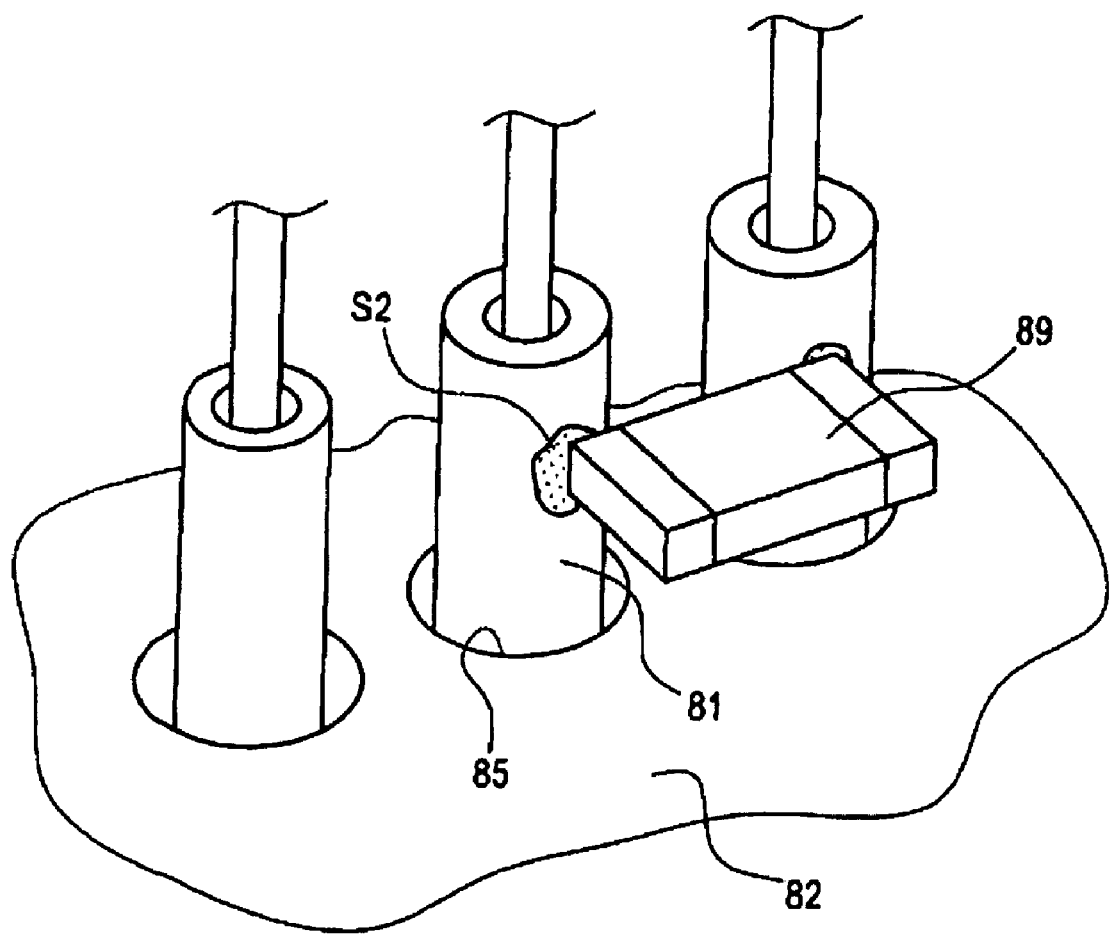
FIG. 12 is an enlarged perspective view of FIG. 11.
Figure 13:
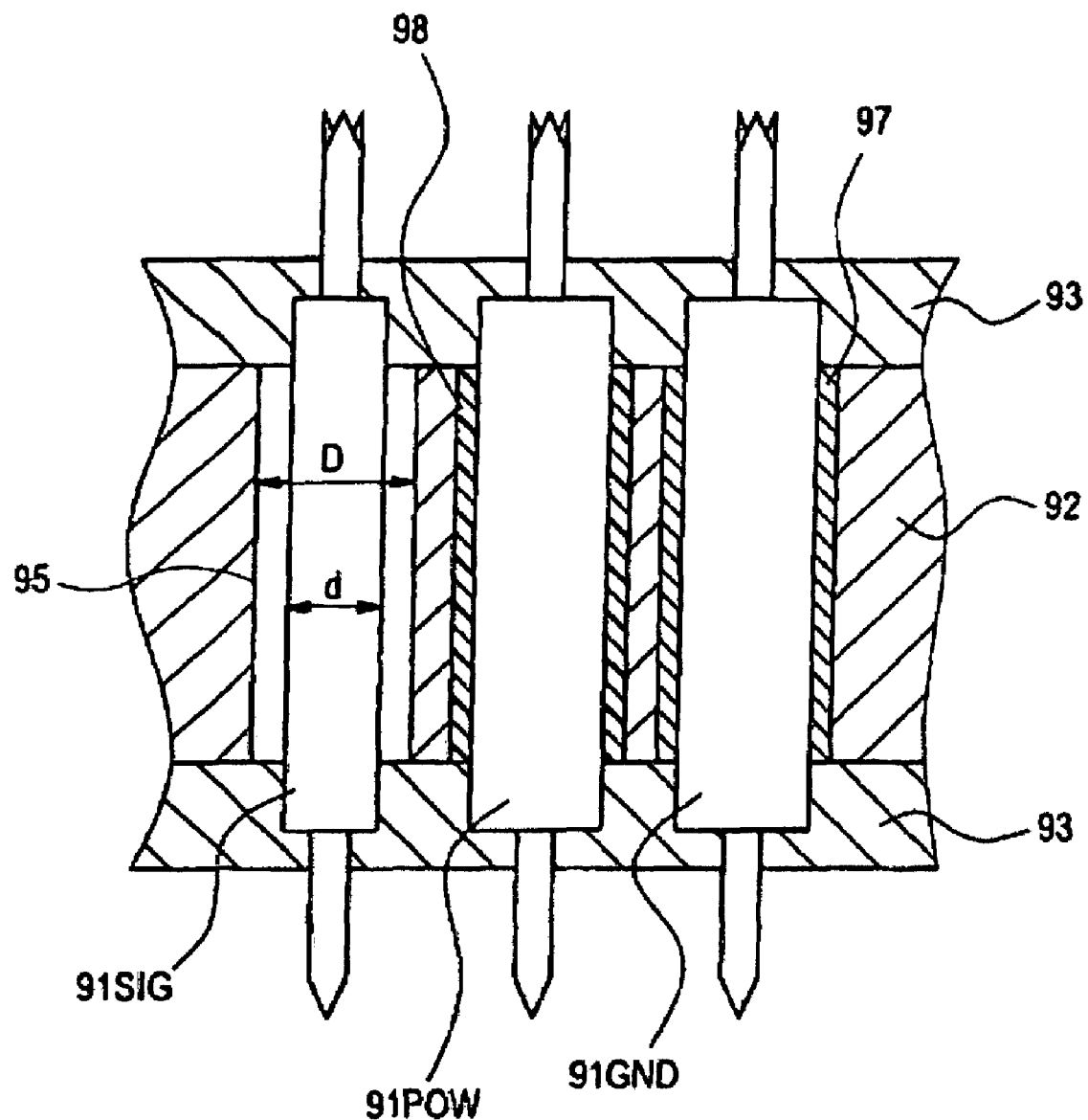
FIG. 13 is a sectional view showing the test socket in the related art.

FIG. 9 shows a manner of connecting a chip capacitor to two probes, namely, a probe for power supply and a probe for grounding. In the third embodiment, the chip capacitor is disposed on a holding plate in contrast to the first embodiment and the second embodiment.

In FIG. 9, a probe 51POW and a probe 51GND are respectively inserted into through holes 55 which are formed in a support block 52 formed of metal, respectively being interposed with an insulating tube 65 and a ground tube 66 formed of metal. The probe 51POW and the probe 51GND are held and fixed by a holding plate 53 formed of resin. An insulating film 56 is interposed between the support block 52 and the holding plate 53 at the upper side, and the probes 51 are projected from through holes 57 which are formed in the insulating film 56. The holding plate 53 is formed with through holes 61 through which plungers 58 can pass, corresponding to positions of the probes 51, and with dented parts 62 concentrically with the through holes 61 so that the probes 51 may be fixed by shoulder parts of the probes 51, that is, end parts of the metal pipes 54 so as not to escape. Moreover, the holding plate 53 is formed with a relief part 67 in a concave shape in which the chip capacitor 53 may be disposed. In addition, plated coatings 60 have been formed in advance in the relief part 67 and the section between the through holes 61 in vicinity of the relief part 67 and the position of the chip capacitor 59 for the purpose of wiring to the chip capacitor 59. The chip capacitor 59 is disposed at a determined position on a surface of the relief part 67 (a face opposed to the support block 52 in FIG. 9). This holding plate 53 is mounted on the insulting film 56 in such a manner that the dented parts 62 are lightly press-fitted to the shoulder parts of the probes 51, whereby the metal pipes 54 or the plungers 58 of the respective probes 51 are connected to the plated coating 60 connected to the chip capacitor 59, via the aforesaid plated coatings 60. Out of parts of the plated coatings 60 as shown in FIG. 9, only those parts of the plated coatings 60 inside the two dented parts 62 (at the sides opposed to the chip capacitor 59) contribute to connection of the metal pipes 54. Moreover, in this third embodiment too, it is possible to change the position of the chip capacitor 59 as desired, in the same manner as in the second embodiment.

As described herein above, according to the test socket of this invention, it is possible to conduct reliable test of performance very stably.

What is claimed is:

1. A test socket, comprising:

a support block formed with resin material, having a first face, a second face opposed to the first face, and a first through hole and a second through hole which communicate between the first face and the second face, the first face, the second face, and the first and second through holes being covered with an electrically conductive plated coating;

a first probe and a second probe, electrically connected to terminals of a device to be tested which is provided on a side of the first face and to terminals connected to a testing apparatus which is provided on a side of the second face, the first probe being provided in the first through hole and electrically connected to the plated coating on the first through hole, the second probe being provided in the second through hole and electrically connected to the plated coating on the second through hole; and an electronic component, wherein a pattern for defining a first region electrically connected to the first probe via the plated coating and a second region electrically connected to the second probe via the plated coating is formed by partially removing the plated coating on the first face and the second face, the second region being electrically isolated from the first region, and electrodes of the electronic component are respectively connected to the first region and the second region.

2. The socket as claimed in claim 1, wherein the electronic component is disposed on a side of the first face.

3. The socket as claimed in claim 1, wherein the first probe and the second probe are covered with electrically conductive covers, and are electrically connected to the plated coating on the first through hole and the plated coating on the second through hole via the electrically conductive covers.

4. The socket as claimed in claim 1, wherein the first probe includes a probe for power supply, and the second probe includes a probe for grounding.

5. The socket as claimed in claim 1, wherein the electronic component includes a capacitor.

6. A test socket, comprising:

a support block, having a first face, a second face opposed to the first face, and a first through hole and a second through hole which communicate between the first face and the second face;

a first probe and a second probe, electrically connected to terminals of a device to be tested which is provided on a side of the first face and to terminals connected to a testing apparatus which is provided on a side of the second face, the first probe being provided in the first through hole, the second probe being provided in the second through hole;

a holding plate, adapted to hold the first probe and the second probe in the support block, the holding plate having a mounting part and holes corresponding to the first through hole and the second through hole, the mounting part having a concave shape including a surface opposed to the support block; and an electronic component, including electrodes and disposed on the surface, wherein electrically conductive plated coatings are formed at predetermined positions of the holes and at a predetermined position of the mounting part which are connected to each other, the electrodes of the electronic component are connected to the predetermined position of the mounting part, and the probes are connected to the predetermined positions of the holes, and the probes are electrically connected to the electrodes of the electronic component via the plated coatings.

* * * * *